(12) United States Patent
Osterloh et al.

(10) Patent No.: US 9,269,834 B2
(45) Date of Patent: Feb. 23, 2016

(54) PHOTOVOLTAIC MODULE MONITORING AND CONTROL

(75) Inventors: Gerhard Osterloh, Schulp (DE); Ralf Beier, Hamburg (DE); Frank Matschullat, Hamburg (DE)

(73) Assignee: NXP B.V., Eindhoven (NL)

( * ) Notice: Subject to any disclaimer, the term of this patent is extended or adjusted under 35 U.S.C. 154(b) by 828 days.

(21) Appl. No.: 13/537,836

(22) Filed: Jun. 29, 2012

(65) Prior Publication Data

US 2014/0001865 A1   Jan. 2, 2014

(51) Int. Cl.
*H02J 1/00* (2006.01)
*H02J 3/00* (2006.01)
*H01L 31/02* (2006.01)
*H02S 50/10* (2014.01)

(52) U.S. Cl.
CPC .......... *H01L 31/02021* (2013.01); *H02S 50/10* (2014.12); *Y02E 10/50* (2013.01); *Y10T 307/685* (2015.04)

(58) Field of Classification Search
CPC ... H01L 31/02021; H02S 50/10; Y02E 10/50; H02J 1/00; H02J 3/383; H02J 3/385; H02J 7/0063; H02J 7/0016; H02J 7/0014; H02J 1/06; H02J 1/10; H02J 1/102; H02J 7/0024; H02J 7/0026; H02J 7/345; H02J 13/0003; H02J 1/12; H02J 7/0019

USPC .......................................................... 307/77
See application file for complete search history.

(56) References Cited

U.S. PATENT DOCUMENTS

| | | | | |
|---|---|---|---|---|
| 6,046,514 | A * | 4/2000 | Rouillard et al. | 307/77 |
| 6,515,215 | B1 * | 2/2003 | Mimura | 136/244 |
| 8,618,456 | B2 * | 12/2013 | Hinman et al. | 250/203.4 |
| 2011/0031816 | A1 * | 2/2011 | Buthker et al. | 307/82 |
| 2012/0043818 | A1 * | 2/2012 | Stratakos et al. | 307/77 |
| 2012/0319489 | A1 * | 12/2012 | McCaslin et al. | 307/77 |

* cited by examiner

*Primary Examiner* — Jared Fureman
*Assistant Examiner* — Esayas Yeshaw (57) ABSTRACT

In one embodiment, an apparatus includes a plurality of photovoltaic units having respective pairs of first and second power terminals connected in series. Each photovoltaic unit in the series includes a bypass switch connected in parallel with the photovoltaic current source of the photovoltaic unit. The bypass switch is configured to provide a bypass of the photovoltaic current source in response to a respective switch control signal. A control circuit determines electrical characteristics of the one or more of the plurality of photovoltaic units by operating the bypass switches of one or more of the photovoltaic units in an open state and operating the bypass switches of the other ones of the photovoltaic units in a closed state. Electrical characteristics exhibited by the series connection of the plurality of photovoltaic units are measured using a detection circuit.

25 Claims, 6 Drawing Sheets

PHOTOVOLTAIC MODULE MONITORING AND CONTROL

Aspects of the present disclosure relate to apparatuses, devices, and methods involving photovoltaic power generation and selective bypassing of photovoltaic units thereof.

Systems for photovoltaic power generation typically include one or more photovoltaic units, which each include one or more photovoltaic cells connected in an arrangement to generate a current between two power terminals of the photovoltaic unit in response to exposure to a light source. The photovoltaic cells of a photovoltaic unit may be organized, via serial and/or parallel connections, into a number of arrangements to generate current between the two power terminals of the photovoltaic unit. Each of the photovoltaic cells generates a respective current when exposed to a light source. A plurality of photovoltaic cells may be connected together in series and/or parallel to form a photovoltaic module. Photovoltaic modules may be sealed in an environmentally protective laminate to protect the photovoltaic cells contained therein. Multiple photovoltaic modules may be connected together in series and/or parallel to form a photovoltaic panel. Multiple photovoltaic panels may be connected together in series and/or parallel to form a photovoltaic array. It is understood that the photovoltaic cells of a photovoltaic unit may be organized into modules, panels, arrays, or any other hierarchical level.

The photovoltaic units are connected in series in order to generate a desired voltage which may be, for instance, suitable for DC-AC conversion to a mains voltage. For ease of reference, the series arrangement of photovoltaic units may be referred to as a string. Several strings may be connected together in parallel to increase overall current and power output.

In certain circumstances, different photovoltaic units in a string may generate different amounts of current. For instance, if a photovoltaic unit in a string is shaded, current generated by the photovoltaic unit may be reduced. Similarly, current generated by a photovoltaic unit may be reduced if the unit is dirty or covered with debris. Current generated by a photovoltaic unit may also be reduced as a result of physical or electrical damage. Such damage may be catastrophic, in that the photovoltaic unit is no longer generated, or may result in a gradual decline of the generated current over the lifetime of the photovoltaic unit. Because photovoltaic units in the string are series-connected, current through the series segment is limited to the lowest photocurrent produced by a unit of the series segment. For ease of reference, a photovoltaic unit that generates a reduced current that limits current of other photovoltaic units in a string may be referred to as an underperforming unit.

One or more embodiments provide a method and apparatus that allows individual photovoltaic units in a string to be bypassed. An underperforming photovoltaic unit may be bypassed such that current generated by the string is not limited by the underperforming photovoltaic unit. For instance, in one embodiment, an apparatus includes a plurality of photovoltaic units having respective pairs of first and second power terminals connected in series to form a string. Each photovoltaic unit in the string includes a bypass switch connected in parallel with a photovoltaic current source of the photovoltaic unit. The photovoltaic current source includes one or more photovoltaic cells configured to generate a current between the first and second power terminals in response to exposure to a light source. The bypass switch is configured to provide a bypass of the photovoltaic current source in response to a respective switch control signal.

The ability to bypass individual ones of the photovoltaic units also provides an efficient means to test electrical characteristics (e.g., current and voltage) of each photovoltaic unit so that a configuration of the photovoltaic units in the string that generates the desired (e.g., greatest) power can be determined. In one embodiment, a detection circuit is configured to measure one or more electrical characteristics exhibited by the string of photovoltaic units. A control circuit is configured to determine the one or more electrical characteristics exhibited by one or more of the plurality of photovoltaic units by operating the bypass switches to bypass current sources of other ones of the plurality of photovoltaic units. The control circuit is configured to measure the one or more electrical characteristics exhibited by the series connection of the plurality of photovoltaic units using the detection circuit.

As indicated above, current through each photovoltaic unit in a string may be limited to the current of an underperforming photovoltaic unit even though other photovoltaic units are capable of generating larger current. As a result, it can be difficult to assess which photovoltaic units generate the largest currents in order to determine which combination of the photovoltaic units would generate the greatest amount of power. For instance, in many power generation applications, photovoltaic units may generate high voltages and currents. Detection circuits capable of tolerating such voltages and currents can be prohibitively expensive.

In one or more embodiments, electrical characteristics of an individual or a combination of photovoltaic units in a string are tested by configuring the bypass switches to bypass other photovoltaic units in the string and testing electrical characteristics exhibited by the string. This allows current and/or voltage of the individual units to be measured using the same detection circuit, which can be connected to measure the current and/or voltage generated by the entire string of photovoltaic units.

In one embodiment, a method of operating a plurality of photovoltaic circuits connected in series is provided. A plurality of bypass switches is connected in parallel with respective ones of the plurality of photovoltaic circuits. Electrical characteristics (e.g., voltage current, or power) of a first photovoltaic circuit of the plurality is determined by operating a first bypass switch of the plurality (connected in parallel with the first one of the photovoltaic units) in an open state and operating other ones of the plurality of bypass switches in a closed state. The one or more electrical characteristics exhibited by the series connection of the plurality of photovoltaic circuits are then measured using a detection circuit to determine the electrical characteristics exhibited by the first photovoltaic circuit. Electrical characteristics of a second photovoltaic circuit of the plurality are determined by operating a second bypass switch of the plurality (connected in parallel with the second photovoltaic circuit) in the open state, and operating other ones of the plurality of bypass switches in the closed state. The electrical characteristics exhibited by the series-connection of the plurality of photovoltaic circuits are then measured using a detection circuit to determine the electrical characteristics exhibited by the second photovoltaic circuit.

In some embodiments, a control circuit is configured to determine a combination of photovoltaic units in a string that generate the most power. For instance, in one embodiment, an apparatus includes a plurality of photovoltaic units having respective pairs of first and second power terminals connected in series to form a string. Each photovoltaic unit in the string includes a bypass switch connected in parallel with the photovoltaic current source of the photovoltaic unit. The photovoltaic current source includes one or more photovoltaic cells configured to generate a current between the first and second power terminals in response to exposure to a light source. The bypass switch is configured to provide a bypass of the photovoltaic current source in response to a respective switch control signal. A control circuit of the apparatus is configured to adjust the switch control signals to operate the bypass switches in a plurality of different configurations. The control circuit determines a select configuration of the bypass switches, in which the plurality of photovoltaic units generate the most power based on electrical characteristics exhibited by the series connection of photovoltaic units.

The above summary is not intended to describe each embodiment or every implementation of the present disclosure. The figures, detailed description, and claims that follow more particularly exemplify various embodiments.

Aspects of the present disclosure may be more completely understood in consideration of the detailed description of various embodiments of the present disclosure that follows in connection with the accompanying drawings, in which.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure are believed to be applicable to a variety of different types of devices, systems and arrangements, including those that may be implemented in control of individual photovoltaic units. While the present disclosure is not necessarily limited to such applications, various aspects of the invention may be appreciated through a discussion of various examples using this context.

In photovoltaic power generation systems, a plurality of photovoltaic units are often connected in series to form a string that generates a desired voltage. However, if a photovoltaic unit in a string is underperforming (e.g., damaged/shaded), the underperforming photovoltaic unit may limit current generated by other photovoltaic units in the string. One or more embodiments provide a method and apparatus that allows underperforming photovoltaic units in the string to be bypassed, such that current generated by the string is not limited by the underperforming photovoltaic unit. For instance, in one embodiment, each photovoltaic unit in the string includes a bypass switch connected in parallel with the photovoltaic current source of the photovoltaic unit. The bypass switch is configured to provide a bypass of the photovoltaic current source in response to a respective switch control signal. For ease of reference, bypassing a photovoltaic current source of a photovoltaic unit may be referred to as bypassing the photovoltaic unit and such phrases are used interchangeably herein. The ability to bypass individual photovoltaic units in a string allows the string to be dynamically reconfigured to connect different combinations of the photovoltaic units together in series while bypassing others. As such, the string may be dynamically reconfigured to select different combinations of the photovoltaic units for testing or power generation.

In one embodiment, a detection circuit is configured to measure one or more electrical characteristics exhibited by the string of photovoltaic units. A control circuit is configured to determine the one or more electrical characteristics exhibited by one or more of the plurality of photovoltaic units by operating the bypass switches of one or more of the plurality of photovoltaic units in the open state and operating the bypass switches of the other ones of the plurality of photovoltaic units in the closed state. The control circuit is then configured to measure the one or more electrical characteristics exhibited by the series connection of the plurality of photovoltaic units using the detection circuit. This can be particularly useful for allowing the reuse of a common/single detection circuit for different photovoltaic units, or different combinations thereof.

In some embodiments, a control circuit is configured to determine a combination of photovoltaic units in a string that generates the most power. The control circuit is configured to adjust the switch control signals to operate the bypass switches in a plurality of different configurations to bypass different combinations of the photovoltaic units. The control circuit determines a particular configuration of the bypass switches in which the plurality of photovoltaic units generate the most power based on electrical characteristics exhibited by the series connection of photovoltaic units.

In one embodiment, the control circuit is configured to test individual ones of the photovoltaic units in a string. For a photovoltaic unit to be tested, the control circuit adjusts control signals to operate the bypass switches so that all other photovoltaic units in the string are bypassed. In this configuration of bypass switches, the current and voltage generated by the string will be equal to the current and voltage generated by the individual photovoltaic unit that is not bypassed. As such, current and voltage of the individual photovoltaic unit can be measured using a detection circuit connected to measure current and voltage between the power terminals at the ends of the string. This process can then be repeated for each photovoltaic unit in the string. After determining the current and voltage of each individual photovoltaic unit, the control circuit computes a combination of the photovoltaic units that generates the largest amount of power.

In another embodiment, the control circuit is configured to select different combinations of the photovoltaic units by operating the bypass switches to bypass other ones of the photovoltaic units. Electrical characteristics of the different combinations are measured sequentially. The combination that generates the largest amount of power is then determined.

Figure 1:
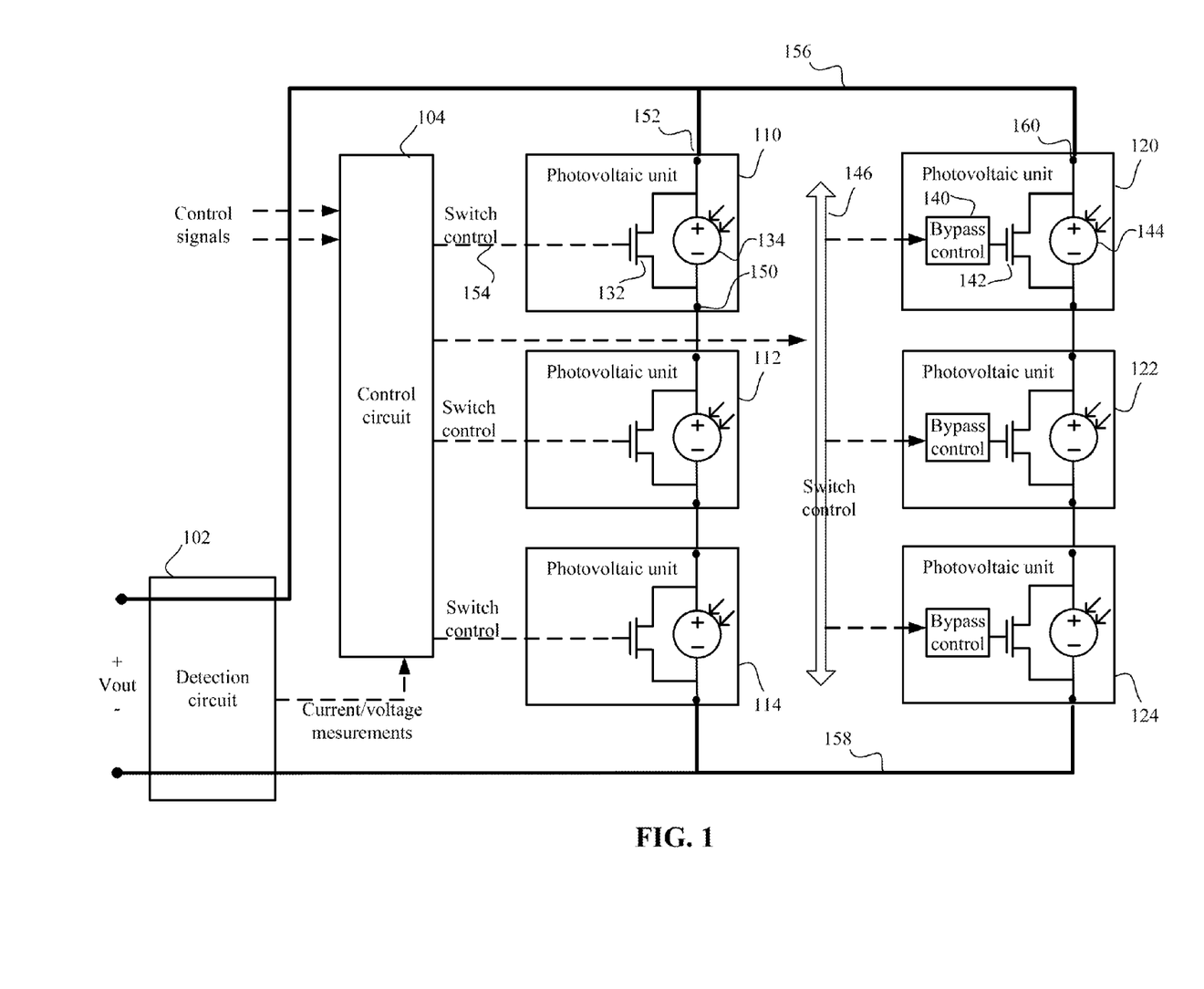
FIG. 1 shows a photovoltaic circuit arrangement configured in accordance with one or more embodiments.

FIG. 1 shows a photovoltaic circuit arrangement in accordance with one or more embodiments. The circuit arrangement includes a plurality of photovoltaic units 110, 112, 114, 120, 122, and 124 having respective pairs of first and second power terminals (e.g., 150 and 152). In this example, power terminals of photovoltaic units 110, 112, and 114 are connected together in series to form a first string, and power terminals of photovoltaic units 120, 122, and 124 are connected together in series to form a second string that is connected in parallel to the first string. It is recognized that different applications may utilize different numbers of strings connected in parallel and/or utilize strings having a different numbers of photovoltaic units connected in series.

Each photovoltaic unit (e.g., 110) includes a photovoltaic current source 134 that is connected between the first and second power terminals (150 and 152) of the photovoltaic unit. The photovoltaic current source 134 includes one or more photovoltaic cells that are arranged to generate a current between the first and second power terminals (150 and 152) when the cells are exposed to a light source. A bypass switch (e.g., 132) is connected in parallel with the photovoltaic current source (e.g., 134) of each photovoltaic unit. The bypass switch (e.g., 132), is configured to provide a bypass of the photovoltaic current source (e.g., 134) in response to a respective switch control signal. For instance, when the bypass switch 132 is operated in an open state, current is directed from the first power terminal 150, through the photovoltaic current source 134 to the second power terminal 152. In contrast, when the bypass switch 132 is operated in a closed state, current presented to the first power terminal 150 is directed through the bypass switch 132 to the second power terminal 152. Additionally, when the bypass switch 132 is operated in a closed state, the photovoltaic current source 134 is shorted by the bypass switch 132. As a result, current and voltage generated by the photovoltaic current source 134 does not contribute to the overall current and voltage of the string.

Control circuit 104 is configured to adjust the respective switch control signals to operate the bypass switches (e.g., 132) in either the open or closed state. In some implementations, the control circuit is configured to transmit the switch control signals to the bypass switches using respective signal lines. For instance, switch control signals used to configure bypass switches of the first string are transmitted from the control circuit 104 to the photovoltaic units 110, 112, and 114 of the first string using respective signal lines (e.g., 154).

In some other implementations, control circuit 104 is configured to transmit the switch control signals to the bypass switches using a data bus. For instance, switch control signals used to configure bypass switches of the second string are transmitted from the control circuit 104 to the photovoltaic units 120, 122, and 124 of the second string using a data bus 146. Photovoltaic units of the second string are similar to photovoltaic unit 110 in the first string, but also include a respective bypass control circuit (e.g., 140) that is configured to implement a protocol used by the data bus 146 to receive and/or decode signals transmitted on the data bus. In response to a received switch control signal indicating a first data value, the bypass control circuit (e.g., 140) is configured to operate the switch (e.g., 142) of the photovoltaic unit in the open state so that the photovoltaic current source (e.g., 144) is not bypassed. Conversely, in response to the received switch control signal indicating a second data value, the bypass control circuit (e.g., 140) is configured to operate the switch (e.g., 142) of the photovoltaic unit in the closed state so that the photovoltaic current source (e.g., 144) is bypassed.

It is recognized that the control circuit 104 may be configured to transmit switch control signals to photovoltaic units over data bus 146 using a number of different serial or parallel data bus protocols including, but not necessarily limited to, Local Interconnect Network (LIN), Firewire, Universal Serial Bus (USB), Inter-Integrated Circuit ($I^2C$) or SMBus. In some implementations, the control circuit 104 is configured to communicate the switch control signals to photovoltaic units using a data bus protocol over power-providing lines 156 and 158. In such implementations, the bypass control circuits (e.g., 140) are coupled to received the data control signals from the power-providing line (e.g., at power terminal 160).

The control circuit 104 is configured to adjust the switch control signals to operate the bypass switches in a plurality of different configurations to dynamically connect different combinations of photovoltaic units of a string in series by bypassing other ones of the photovoltaic units. As described above, the control circuit is configured to determine power generated by one or more of the photovoltaic units in a string by adjusting the switch control signals to bypass other photovoltaic units in the string. Once the other photovoltaic units have been bypassed, electrical characteristics of the string may be measured to determine the electrical characteristics of the combination of the one or more photovoltaic units. The photovoltaic system show in FIG. 1 includes a detection circuit 102 configured to measure electrical characteristics (e.g., current and voltage) generated by each string. Electrical characteristics measured by the detection circuit 102 are transmitted to control circuit 104 for further assessment.

In the example shown in FIG. 1, detection circuit 102 is connected to measure overall current and voltage generated by all of the strings connected in parallel. However, in some embodiments, a separate detection circuit may be provided for each string to measure only current and voltage of that string. It is recognized that for many power generation applications, the photovoltaic units may generate high voltages and currents. As such, some high accuracy detection circuits capable of tolerating such voltages and currents can be expensive. Because detection circuit 102 can be used to test individual photovoltaic units in a string, manufacturing costs can be reduced—allowing more expensive detection circuitry to be used.

Some embodiments may also include additional detection circuits to test individual photovoltaic units or subgroups of photovoltaic units in a string. For instance, in addition to detection circuit 102, less expensive detection circuits may be provided for each photovoltaic unit. For example, in one or more embodiments, a respective continuity detection circuit is provided for each photovoltaic unit. Discontinuity between power terminals of a photovoltaic unit can result in catastrophic failure of a photovoltaic unit. It is recognized that other types of detection circuits may be included as well.

Although a photovoltaic system may include any number of strings, for ease of reference the embodiments are primarily discussed with reference to operation of a single string.

In some embodiments, a control circuit is configured to determine a desired/optimal combination of photovoltaic units in a string. For instance, the desired combination can be the combination that generates the most power. In other instances, the desired combination can be the combination that provides power with the least variance overtime (or with less noise). For ease of explanation, the embodiments are primarily described with reference to a desired combination that provides the most power. However, it is recognized that the embodiments may determine other desired/optimal combinations as well (e.g., combination having the least variance). The control circuit is configured to adjust the switch control signals to operate the bypass switches in a plurality of different configurations to bypass various ones of the photovoltaic units. The control circuit determines a select configuration of the bypass switches in which the plurality of photovoltaic units generate the most power based on electrical characteristics exhibited by the series connection of photovoltaic units.

Figure 2:
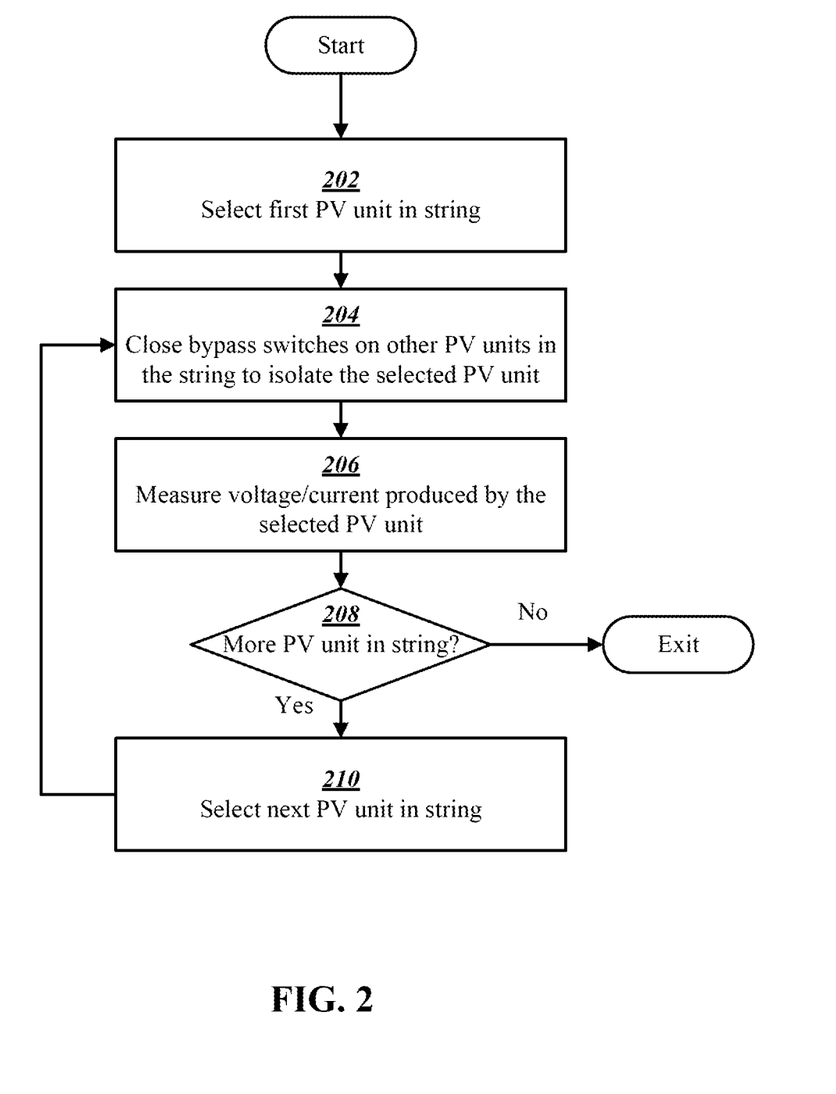
FIG. 2 shows a flowchart of a process for measuring electrical characteristics of an individual one of a plurality of photovoltaic units connected in series, consistent with one or more embodiments.

In one embodiment, the control circuit is configured to determine a combination of photovoltaic units in a string that generate the greatest amount of power by individually testing each one of the photovoltaic units in a string. For instance, FIG. 2 shows a flowchart of a process for measuring electrical characteristics of each individual photovoltaic in a string. A first photovoltaic unit in the string is selected at block 202. Bypass switches of other photovoltaic units in the string are closed at block 204 to bypass the other photovoltaic units and isolate the selected photovoltaic unit. One or more electrical characteristics, e.g., current, voltage, etc. of the selected photovoltaic unit are measured at block 206 by measuring the electrical characteristics of the string. While there are additional photovoltaic units in the string to be tested at decision block 208, the next photovoltaic unit is selected at block 210 and the isolation and measuring steps are repeated for the selected photovoltaic unit at blocks 204 and 206.

Figure 3:
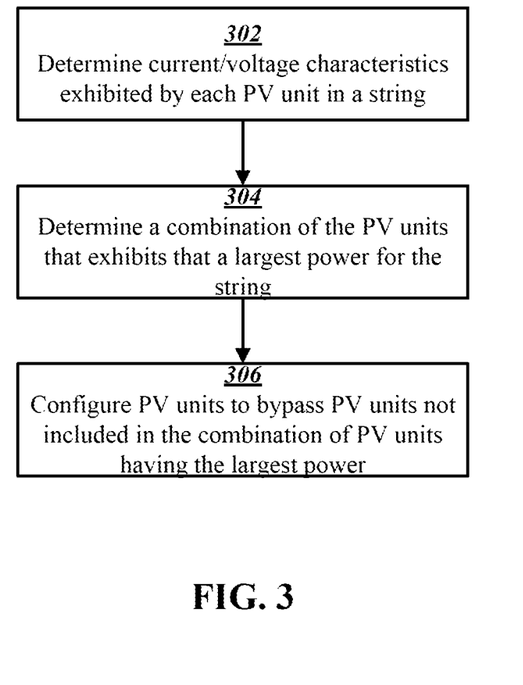
FIG. 3 shows a flowchart of a process for efficiently operating a plurality of photovoltaic units connected in series, consistent with one or more embodiments.

FIG. 3 shows a flowchart of a process for efficiently operating a plurality of photovoltaic units connected in series. Electrical characteristics (e.g., current/voltage) of each photovoltaic unit in a series are determined at block 302. The combination of the photovoltaic units that exhibits the largest power of the series is determined at block 304. Photovoltaic units are configured at block 306 to bypass photovoltaic units in the series that are not included in the determined combination that exhibits the largest amount of power.

Figure 4:
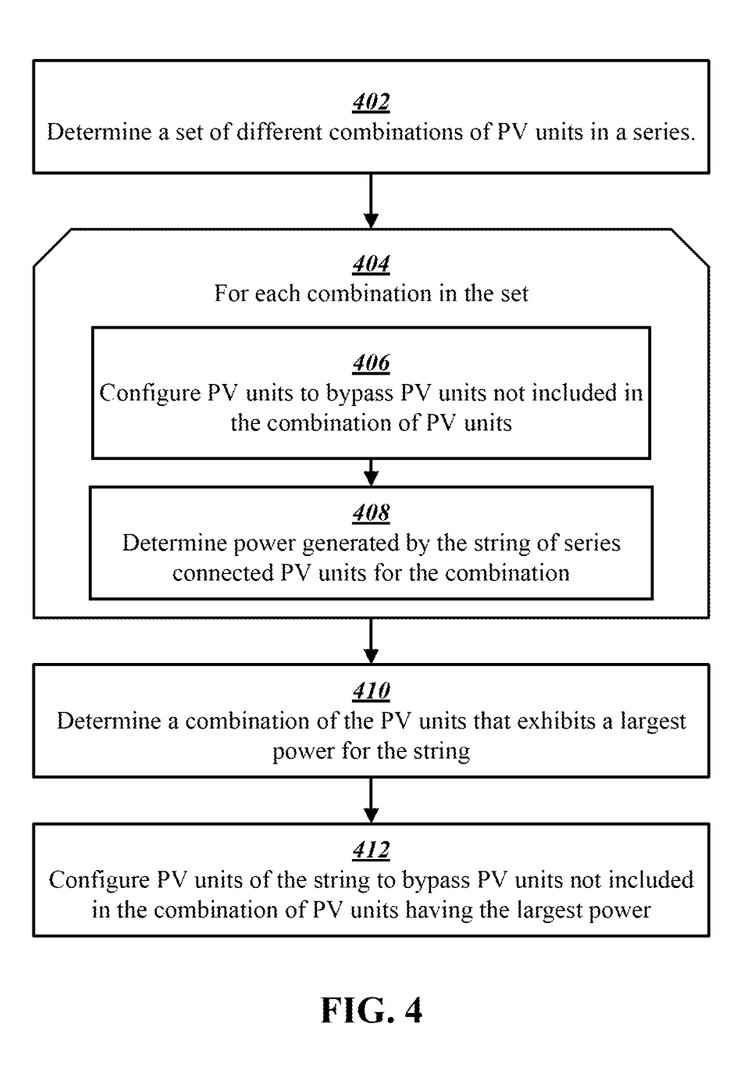
FIG. 4 shows a flowchart of a process for determining an optimal configuration of photovoltaic units connected in series, consistent with one or more embodiments.

In another embodiment, the control circuit is configured to determine a combination of photovoltaic units in a string that generate the greatest amount of power by iteratively testing electrical characteristics of the different combinations. For each combination the bypass switches to isolate the combination of photovoltaic units by bypassing other ones of the photovoltaic units and electrical characteristics of the string are tested. FIG. 4 shows a flowchart of a process for determining an optimal configuration of photovoltaic units in a string by testing electrical characteristics of different combinations. A set of different combinations of photovoltaic units in a string are determined at block 402. For each combination in the set at loop 404, photovoltaic units are configured to bypass photovoltaic units that are not included in the combination at block 406. Power generated by the configuration set at block 406 is determined at block 408. The combination of photovoltaic units that exhibits the largest amount of power for string is determined at block 410. Photovoltaic units are configured at block 412 to bypass PV units not included in the combination that is determined to exhibit the largest amount of power.

Figure 5:
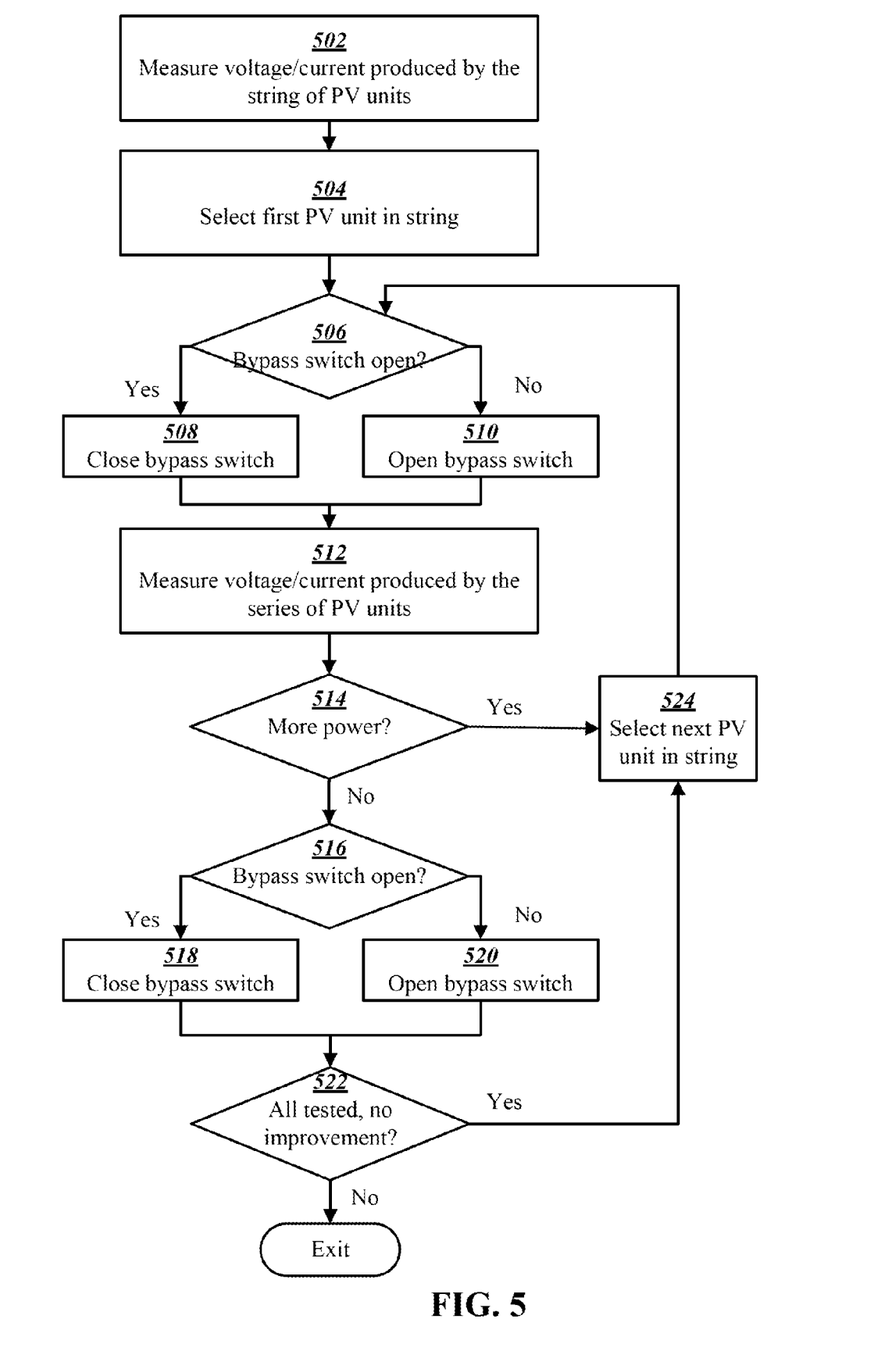
FIG. 5 shows an example process flow during operation of a photovoltaic system configured in accordance with one or more embodiments.

In some embodiments, power generated by a string of photovoltaic units may be improved by sequentially toggling bypass switches of photovoltaic units in the string and testing to see if power generated is increased or reduced. For instance, FIG. 5 shows a flowchart of a process for periodic monitoring and power optimization of a string of photovoltaic cells during operation. Voltage/current produced by a string of photovoltaic units is measured at block 502. A first PV unit in the string is selected at block 504. If the bypass switch of the selected photovoltaic unit is open at decision branch 506, the switch is closed at block 508. Conversely, if the bypass switch is closed at decision branch 506, the switch is opened at block 510. The voltage/current produced by the string is again measured at block 512. If toggling the bypass switch produces more power at decision branch 514, the new configuration is retained and the next photovoltaic unit is the string is selected at block 524. Otherwise, the bypass switch is again toggled to restore the previous configuration. As described above, if the bypass switch is open at decision branch 516, the switch is closed at block 518. Otherwise, the bypass switch is opened at block 520. The next photovoltaic unit in the string is selected at block 524 and the process is repeated until each photovoltaic unit has been selected in a cycle without improving power at decision block 522.

According to certain embodiments of the present disclosure, a failed photovoltaic unit can be identified from within a string using a binary search algorithm. In a particular, non-limiting example, failure of a photovoltaic unit in a string may cause the entire string to stop producing adequate power. For instance, the photovoltaic unit may be damaged so as to prevent current from flowing through the string. A binary, or other suitable, search can be used to quickly identify the failed photovoltaic unit. Once located, the photovoltaic unit can be bypassed and/or identified for replacement or repair.

The process can be particularly useful for recovering from catastrophic failures. As indicated above, a photovoltaic unit may suffer from a catastrophic failure that substantially prevents any current from passing through the string. For large scale power generation and other critical applications, it can be important to quickly locate a faulty photovoltaic unit so it can be bypassed to allow power to be generated by other ones of the photovoltaic units. Rather than test each photovoltaic unit sequentially, which may be time consuming, a faulty photovoltaic unit may be located using a binary (or other suitable) search algorithm to quickly locate and bypass the photovoltaic unit suffering the catastrophic failure.

In one or more embodiments, power generation may be improved by repeatedly identifying the photovoltaic unit generating the least current and bypassing the photovoltaic unit. A photovoltaic unit that is underperforming in such a manner may indicate a problem with the unit, which may actually reduce the performance of the entire string. For instance, a failing photovoltaic unit may introduce undesired resistance and thereby reduce the power providing ability of the entire string. Accordingly a search algorithm can be used to identify a photovoltaic unit that that generates the least amount of current. This identified photovoltaic unit can then be bypassed and the power generated by the string is measured. If power of the string is increased by bypassing the photovoltaic unit, the bypass can be maintained. The process of identifying and bypassing photovoltaic units can then be repeated until power generated by the string decreases, relative to no bypassing. When power decreases after bypassing a photovoltaic unit, the bypass switch of the unit is reconfigured so that the unit is no longer bypassed and the process is completed. As a result, the system is configured to bypass photovoltaic units that reduce the overall performance of the string.

The testing and configuration processes discussed herein may be initiated in response to a number of different events/signals. For instance, a test mode can be entered in response to user input (e.g., a user command that specifies that a diagnostic/maintenance test is to be run on the photovoltaic units) or to a periodic or preset timing. In other instances, the configuration can be automatically initiated after a system is first installed. Still other instances respond to a trigger event, such as a significant reduction in provided power or to disproportionate power from different strings.

Figure 6:
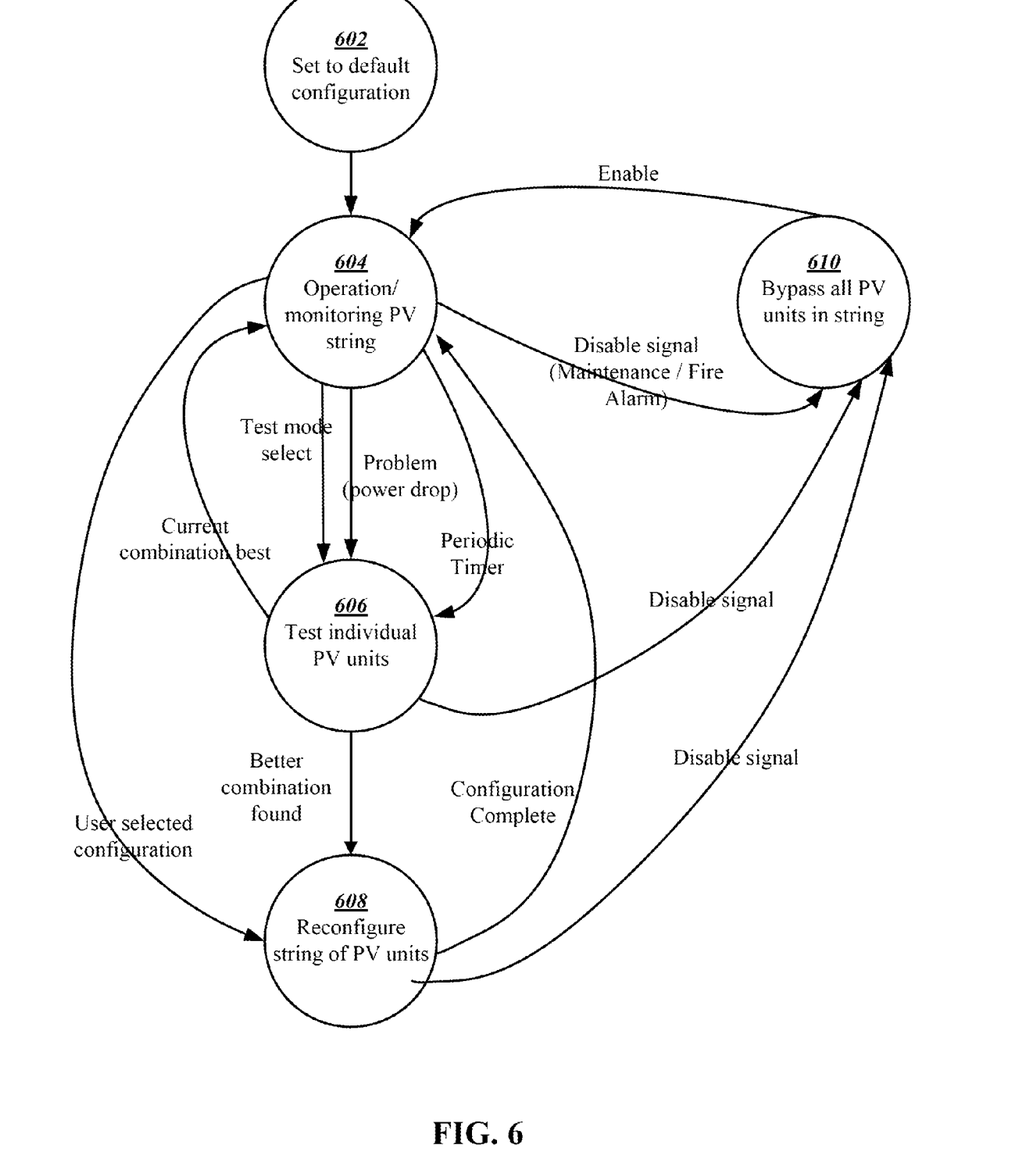
FIG. 6 shows a flowchart of a process for periodic monitoring and power optimization of a series of photovoltaic cells during operation, in accordance with one or more embodiments.

In certain embodiments a test mode can be initiated in order to determine a configuration for bypassing problematic photovoltaic units in order to improve overall performance. The control circuit may enter such a test mode periodically, in response to electrical characteristics of the string during operation, in response to a test mode select signal, etc. For instance, FIG. 6 shows an example process flow during operation of a photovoltaic system configured in accordance with one or more embodiments. Bypass switches are set to a default configuration at 602. After configuration the controller enters and operates/monitors the photovoltaic string at 604. In one implementation, the control circuit may be prompted to test individual photovoltaic units at 606 in response to a test signal. In another implementation, the controller may test individual photovoltaic units in response to an event trigger/problem, such as detection of a power drop. In yet some other implementations, the controller can be configured to test individual photovoltaic units periodically.

If testing at 606 reveals that the current combination of PV units is the best, the controller returns to an operation/monitoring mode 604. Otherwise, if a better combination is found in the testing mode, the photovoltaic units of the string are reconfigured at 608 to implement the better combination. In some implementations, the control circuit may be prompted to reconfigure the string of photovoltaic units in response to receiving a command indicating a specific combination of the photovoltaic units selected by a user. Once configuration is completed, the controller returns to operation/monitoring of the photovoltaic string.

In some implementations, the controller is configured to bypass (610) all photovoltaic units in a string in response to a specific signal or condition. For instance, for safety reasons it can be desirable to bypass all photovoltaic units prior to performing maintenance on the photovoltaic units. In response to receiving a disable signal the control circuit operates bypass switches to bypass all of the photovoltaic units in the string until an enable signal is received. As another example, the controller may bypass all photovoltaic units in a string in response to a command or to a detected short circuit, overvoltage or excessive power drain. This can help avoid damage to the cells due to faulty downstream connection or the like.

The flow shown in FIG. 6 is not intended to represent all possible signals and events or actions taken by the control circuit in response thereto. It is recognized that in different applications, the photovoltaic system may omit or supplement actions illustrated in FIG. 6.

In some embodiments, electronic characteristics of photovoltaic units determined during testing may be stored in a computer readable medium for later analysis and/or report generation. For instance, the controller may store data fields including a photovoltaic unit indicator, a time of day, current, voltage, etc. In some embodiments, a control circuit may be configured to perform testing of electronic characteristics periodically to gather data for report generation and analysis of performance of the photovoltaic units. Such data may be useful to identify shadows that regularly fall on the photovoltaic units at certain times of the day. This may help to assist in placement and orientation of photovoltaic units at a location. The reports can also be used to provide identification of one or more faulty photovoltaic units for maintenance thereof.

In some embodiments, the stored data can then be used to control placement motors to position photovoltaic units to avoid previously-identified shadows. In other implementations, the data can be used to assist a user in removing or adjusting a potential source of a shadow (e.g., where a tree or other obstruction has recently become problematic). In some other embodiments, the controller-provided data can be used to bypass photovoltaic units in advance of previously identified shadows. Bypassing photovoltaic units prior to being shaded may help to improve power generation because power generation of the string is not reduced prior to bypassing of shaded photovoltaic unit. Periodic data of electrical characteristics of photovoltaic units over the long term may also be useful in identifying failing or dirty photovoltaic units or identifying photovoltaic units to be replaced.

The signals and associated logic and functionality described in connection with the figures can be implemented in a number of different manners. Unless otherwise indicated, various general purpose systems and/or logic circuitry may be used with programs in accordance with the teachings herein, or it may prove convenient to construct a more specialized apparatus to perform the required method. For example, according to the present disclosure, one or more of the methods can be implemented in hard-wired circuitry by programming a general-purpose processor, other fully or semi-programmable logic circuitry, and/or by a combination of such hardware and a general-purpose processor configured with software.

It is recognized that aspects of the disclosure can be practiced with computer/processor-based system configurations other than those expressly described herein. The required structure for a variety of these systems and circuits would be apparent from the intended application and the above description.

In certain embodiments, machine-executable instructions can be stored for execution in a manner consistent with one or more of the methods of the present disclosure. The instructions can be used to cause a general-purpose or special-purpose processor that is programmed with the instructions to perform the steps of the methods. Alternatively, the steps might be performed by specific hardware components that contain hardwired logic for performing the steps, or by any combination of programmed computer components and custom hardware components.

In some embodiments, aspects of the present disclosure may be provided as a computer program product, which may include a machine or computer-readable medium having stored thereon instructions which may be used to program a computer (or other electronic devices) to perform a process according to the present disclosure. Accordingly, the computer-readable medium includes any type of media/machine-readable medium suitable for storing electronic instructions.

The various embodiments described above are provided by way of illustration only and should not be construed to limit the disclosure. Based on the above discussion and illustrations, those skilled in the art will readily recognize that various modifications and changes may be made to the present disclosure without strictly following the exemplary embodiments and applications illustrated and described herein. Such modifications and changes do not depart from the true spirit and scope of the present disclosure, which is set forth in the following claims.

What is claimed is:

1. A photovoltaic array apparatus, comprising:
   a photovoltaic string having plurality of photovoltaic units, each photovoltaic unit having respective pairs of first and second power terminals connected in series, each photovoltaic unit including:
   a photovoltaic current source connected between the first and second power terminals, the photovoltaic current source including one or more photovoltaic cells configured and arranged to generate a current between the first and second power terminals in response to exposure to a light source, and
   a bypass switch connected in parallel with the photovoltaic current source and configured and arranged to provide a bypass of the photovoltaic current source in response to a respective switch control signal;
   a detection circuit, configured and arranged to measure one or more electrical characteristics exhibited by the series connection of the plurality of photovoltaic units; and
   a control circuit, configured and arranged to determine the one or more electrical characteristics exhibited by one or more of the plurality of photovoltaic units by:

operating the bypass switches of other ones of the plurality of photovoltaic units to provide the bypass of the photovoltaic current sources of the other ones of the plurality of photovoltaic units, and measuring the one or more electrical characteristics exhibited by the series connection of the plurality of photovoltaic units using the detection circuit.

2. The apparatus of claim 1, wherein the bypass switch is configured and arranged to:
direct the current from the first power terminal to the second power terminal when operating in an open state; and
direct the current through the bypass switch when operated in a closed state.

3. The apparatus of claim 2, wherein the control circuit is configured and arranged to, when operated in a test mode, for each one of the plurality of photovoltaic units:
operate the bypass switch of the one of the plurality of photovoltaic units in the open state and operate the bypass switches of the other ones of the plurality of photovoltaic units in the closed state;
measure the one or more electrical characteristics exhibited by the one of the plurality of photovoltaic units using the detection circuit; and
in response to measuring the one or more electrical characteristics exhibited by each one of the plurality of photovoltaic units, determine a combination of ones of the plurality of photovoltaic units that, when connected directly together in series, produces the largest amount of power, with respect to other combinations of ones of the plurality of photovoltaic units.

4. The apparatus of claim 3, wherein in response to determining the combination of ones of the plurality of photovoltaic units that produces the largest amount of power, the control circuit is configured to exit the test mode, operate the bypass switches of the combination of the plurality of photovoltaic units in the open state, and operate the bypass switches of the other ones of the plurality of photovoltaic units in the closed state.

5. The apparatus of claim 1, wherein the control circuit is configured and arranged to, when operated in a test mode, determine the one or more electrical characteristics exhibited by each individual one of the plurality of the photovoltaic units.

6. The apparatus of claim 5, wherein the control circuit is configured and arranged to enter the test mode in response to user command requesting that a diagnostic/maintenance test be run on the photovoltaic units.

7. The apparatus of claim 5, wherein the control circuit is configured and arranged to enter the test mode periodically.

8. The apparatus of claim 5, wherein in response to determining the one or more electrical characteristics exhibited by each individual one of the plurality of photovoltaic units, the control circuit is configured and arranged to store the determined one or more electrical characteristics exhibited by each individual one of the plurality of photovoltaic units in a computer readable medium and thereby provide identification of one or more faulty photovoltaic units for maintenance.

9. The apparatus of claim 2, wherein:
the control circuit is configured and arranged to, during operation:
use the detection circuit to determine a first amount of power generated by the series connected plurality of photovoltaic units with a first configuration of the bypass switches of the plurality of photovoltaic units;
adjust the respective switch control signals to operate the bypass switches of the plurality of photovoltaic units in a second configuration;
use the detection circuit to determine a second amount of power generated by the series connected plurality of photovoltaic units with the second configuration of the bypass switches;
in response to the first amount of power being greater than or equal to the second amount of power, adjust the respective switch control signals to operate the bypass switches of the plurality of photovoltaic units in the first configuration; and
in response to the second amount of power being greater than the first amount of power, respective switch control signals operate the bypass switches of the plurality of photovoltaic units in the second configuration.

10. The apparatus of claim 9, wherein the control circuit is configured and arranged to transmit each of the switch control signals to a corresponding one of the plurality of photovoltaic units using a respective signal line.

11. The apparatus of claim 9, wherein the control circuit is configured and arranged to transmit the switch control signals to the plurality of photovoltaic units using a data bus.

12. The apparatus of claim 1, wherein the bypass switch includes:
a switch connected in parallel with the photovoltaic current source; and
a bypass control circuit configured to operate the switch in an open state in response to the respective switch control signal indicating a first value, and operate the switch in a closed state in response to the respective switch control signal indicating a second value different from the first value.

13. The apparatus of claim 2, wherein the control circuit is configured and arranged to, in response to a disable signal, operate each bypass switch of the plurality of photovoltaic units in the closed state.

14. The apparatus of claim 13, further comprising:
a fire alarm connected to the control circuit, the fire alarm configured and arranged to generate the disable signal in response to the fire alarm being triggered.

15. An apparatus, comprising:
a plurality of photovoltaic units having respective pairs of first and second power terminals connected in series, each photovoltaic unit including:
a photovoltaic current source connected between the first and second power terminals, the photovoltaic current source including one or more photovoltaic cells configured and arranged to generate a current between the first and second power terminals in response to exposure to a light source, and
a bypass switch connected in parallel with the photovoltaic current source and configured and arranged to provide a bypass of the photovoltaic current source in response to a respective switch control signal; and
a control circuit configured and arrange to adjust the switch control signals to:
operate the bypass switches in a plurality of different configurations, and
determine a select configuration of the bypass switches in which the plurality of photovoltaic units generate the most power based on electrical characteristics exhibited by the series connection of photovoltaic units while operated in the plurality of different configurations.

16. The apparatus of claim 15, wherein in each of the plurality of different configurations a different one of the bypass switches is operated in an open state and other ones of the bypass switches are operated in a closed state.

17. The apparatus of claim 15, wherein:
in each of the plurality of different configurations a respective subset of the plurality of the bypass switches is operated in an open state and other ones of the bypass switches are operated in a closed state; and
the select configuration of the bypass switches in which the plurality of photovoltaic units generate the most power is included in the plurality of different configurations.

18. The apparatus of claim 15, wherein, the control circuit is configured and arranged to, in response to determining the select configuration of the bypass switches in which the plurality of photovoltaic units generate the most power, adjust the switch control signals to operate the bypass switches in the determined configuration.

19. The apparatus of claim 15, wherein, the control circuit is further configured and arranged to, in response to a test mode select signal, determine if there is a configuration of the bypass switches different than the select configuration in which the plurality of photovoltaic units generate more power.

20. The apparatus of claim 15, wherein, the control circuit is further configured and arranged to, in response to operating the bypass switches in the select configuration for a predetermined amount of time, determine if there is a configuration of the bypass switches different than the select configuration in which the plurality of photovoltaic units generate more power.

21. The apparatus of claim 15, wherein, the control circuit is further configured and arranged to, in response to a drop in the power generated by the plurality of photovoltaic units while operating the bypass switches in the select configurations, determine if there is a configuration of the bypass switches different than the select configuration in which the plurality of photovoltaic units generate more power.

22. The apparatus of claim 15, wherein the control circuit is configured and arranged to adjust the switch control signals to operate each of the bypass switches in a closed state to the photovoltaic current source of the corresponding photovoltaic unit in response to a disable signal.

23. The apparatus of claim 15, wherein the control circuit is configured and arranged to, in response to a control signal specifying a user-selected configuration of the bypass-switches, adjust the switch control signals to operating the bypass switches in the user selected configuration.

24. The apparatus of claim 15, wherein, the electrical characteristics include a current generated by the series connection of the plurality of photovoltaic units.

25. A method of operating a plurality of photovoltaic circuits connected in series, comprising:
determining one or more electrical characteristics of a first one of the plurality of photovoltaic circuits, by performing operations including:
operating a first one of a plurality of bypass switches, which are connected in parallel with respective ones of the plurality of photovoltaic circuits, in an open state, the first one of the plurality of bypass switches being connected in parallel with the first one of the plurality of photovoltaic circuits;
operating other ones of the plurality of bypass switches in a closed state; and
measuring the one or more electrical characteristics exhibited by the series connection of the plurality of photovoltaic circuits using a detection circuit; and
determining one or more electrical characteristics of a second one of the plurality of photovoltaic circuits, by performing operations including:
operating a second one of the plurality of bypass switches, which are connected in parallel with respective ones of the plurality of photovoltaic circuits, in the open state, the second one of the plurality of bypass switches being connected in parallel with the second one of the plurality of photovoltaic circuits;
operating other ones of the plurality of bypass switches in the closed state; and
measuring the one or more electrical characteristics exhibited by the series connection of the plurality of photovoltaic circuits using a detection circuit.

* * * * *